United States Patent
Liu et al.

(10) Patent No.: US 9,997,415 B2
(45) Date of Patent: Jun. 12, 2018

(54) FORMATION OF NICKEL SILICON AND NICKEL GERMANIUM STRUCTURE AT STAGGERED TIMES

(71) Applicant: Taiwan Semiconductor Manufacturing Company Limited, Hsinchu (TW)

(72) Inventors: Chi-Wen Liu, Hsinchu (TW); Chao-Hsiung Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/353,825

(22) Filed: Nov. 17, 2016

(65) Prior Publication Data

US 2017/0069544 A1    Mar. 9, 2017

Related U.S. Application Data

(63) Continuation of application No. 14/937,930, filed on Nov. 11, 2015, now Pat. No. 9,508,603, which is a
(Continued)

(51) Int. Cl.
*H01L 21/82* (2006.01)
*H01L 21/8238* (2006.01)
(Continued)

(52) U.S. Cl.
CPC ........... *H01L 21/823814* (2013.01); *H01L 21/31053* (2013.01); *H01L 21/76224* (2013.01);
(Continued)

(58) Field of Classification Search
CPC ... H01L 29/0649; H01L 29/16; H01L 29/165; H01L 29/45; H01L 29/456; H01L 29/665; H01L 27/092; H01L 23/53209; H01L 23/535; H01L 21/823814; H01L 21/31053; H01L 21/76224; H01L 21/823807;
(Continued)

(56) References Cited

U.S. PATENT DOCUMENTS 6,905,922 B2    6/2005  Lin et al.
7,893,502 B2 *  2/2011  Li ................... H01L 21/823807
                                                        257/310
(Continued)

FOREIGN PATENT DOCUMENTS

CN         102479789 A    5/2012

OTHER PUBLICATIONS

Chinese Office Action; Application No. 201410281111.4; dated Jan. 25, 2017.

*Primary Examiner* — Monica D Harrison
(74) *Attorney, Agent, or Firm* — McDermott Will & Emery LLP

(57) ABSTRACT

A semiconductor device includes a substrate, first and second metals, and a second semiconductor material. The substrate includes a first semiconductor material and has first and second substrate portions. The first metal is reacted with the first substrate portion of the substrate. The second semiconductor material is above the second substrate portion of the substrate and is different from the first semiconductor material. The second metal is reacted with the second semiconductor material.

20 Claims, 7 Drawing Sheets

Related U.S. Application Data continuation of application No. 14/132,112, filed on Dec. 18, 2013, now Pat. No. 9,209,252.

(51) Int. Cl.
| | |
|---|---|
| *H01L 29/16* | (2006.01) |
| *H01L 27/092* | (2006.01) |
| *H01L 29/66* | (2006.01) |
| *H01L 29/165* | (2006.01) |
| *H01L 23/532* | (2006.01) |
| *H01L 23/535* | (2006.01) |
| *H01L 21/3105* | (2006.01) |
| *H01L 21/762* | (2006.01) |
| *H01L 21/8258* | (2006.01) |
| *H01L 29/06* | (2006.01) |
| *H01L 29/45* | (2006.01) |

(52) U.S. Cl.
CPC ...... *H01L 21/8238* (2013.01); *H01L 21/8258* (2013.01); *H01L 21/823807* (2013.01); *H01L 21/823828* (2013.01); *H01L 21/823857* (2013.01); *H01L 21/823871* (2013.01); *H01L 21/823878* (2013.01); *H01L 23/535* (2013.01); *H01L 23/53209* (2013.01); *H01L 27/092* (2013.01); *H01L 29/0649* (2013.01); *H01L 29/16* (2013.01); *H01L 29/165* (2013.01); *H01L 29/45* (2013.01); *H01L 29/456* (2013.01); *H01L 29/665* (2013.01); *H01L 2924/0002* (2013.01)

(58) Field of Classification Search
CPC ..... H01L 21/823828; H01L 21/823857; H01L 21/823871; H01L 21/823878; H01L 21/8258
USPC ......................................................... 257/392
See application file for complete search history.

(56) References Cited

U.S. PATENT DOCUMENTS

| | | |
|---|---|---|
| 2005/0074932 A1 | 4/2005 | Lin et al. |
| 2010/0171180 A1 | 7/2010 | Zhang et al. |
| 2010/0193874 A1* | 8/2010 | Ito .................. H01L 21/823814 257/369 |
| 2012/0126331 A1 | 5/2012 | Lin et al. |

* cited by examiner

FORMATION OF NICKEL SILICON AND NICKEL GERMANIUM STRUCTURE AT STAGGERED TIMES

CROSS-REFERENCE TO RELATED APPLICATIONS

This application is a continuation of U.S. patent application Ser. No. 14/937,930, filed Nov. 11, 2015, now U.S. Pat. No. 9,508,603, which is a continuation of U.S. patent application Ser. No. 14/132,112, filed Dec. 18, 2013, now U.S. Pat. No. 9,209,252, both of which are incorporated herein by reference in their entirety.

FIELD

The technology described in this disclosure relates generally to semiconductor device fabrication and more particularly to multi-layer structures.

BACKGROUND

Non-planar transistor structures provide a means to achieve high device performance in a small footprint. The fabrication of such structures is often limited by the material properties of the substances used to create those structures. Performing component formulations in particular orders can increase the menu of available semiconductor configurations that can be achieved by avoiding certain component formulation conflicts.

DETAILED DESCRIPTION

Figure 1:
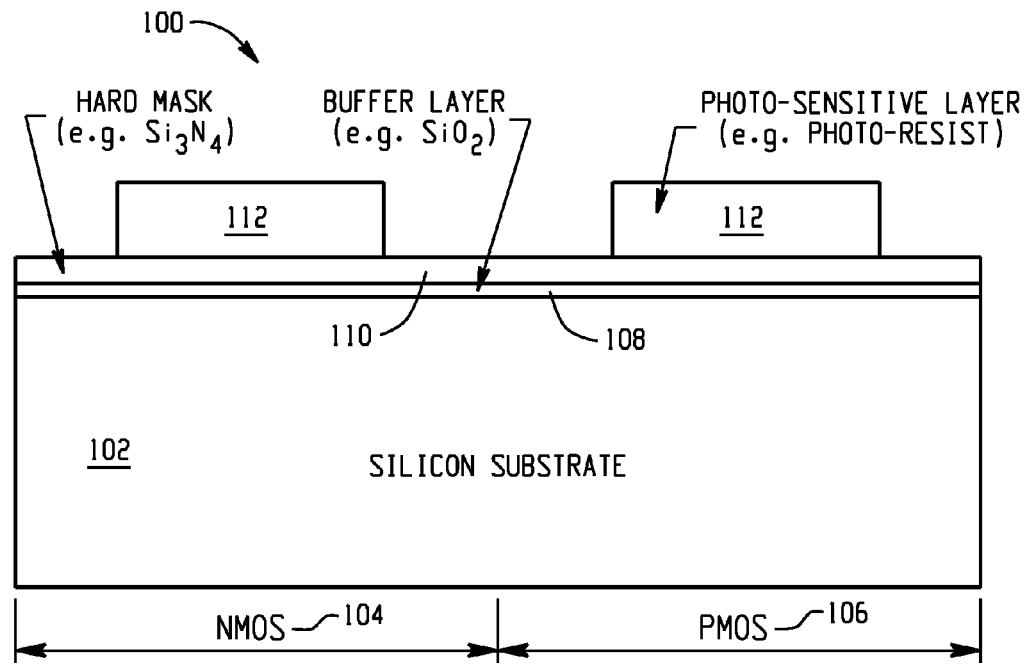
FIG. 1 is a diagram depicting a patterning of a photo-sensitive layer onto a single semiconductor substrate.

When planning a semiconductor fabrication process, certain material properties limit the ability to form different structures. For example, certain semiconductor structure fabrication processes require that the semiconductor structure be exposed to particular temperature levels (e.g., annealing processes between different materials require differing formation temperatures). While some structures require high temperature, other structures could potentially be damaged by exposure to those high temperatures. Strategic ordering of component fabrication avoids certain component formulation conflicts and expands the set of semiconductor configurations available.

The following figures describe an example where a semiconductor device 100 that includes an NMOS transistor 104, having Nickel Silicide source/drain contacts 128, and a PMOS transistor 106, having Nickel Germanide source/drain contacts 150, is formed on a single semiconductor substrate 102 (shown in FIGS. 1-12). The following process enables these structures to be formed, despite the formation temperature of Nickel Germani de for the PMOS 106 transistor being much lower (250-300° C.) than the formation temperature of Nickel Silicid for the NMOS transistor 104 (400-600° C.).

FIG. 1 is a diagram depicting a patterning of a photo-sensitive layer onto a single semiconductor substrate. A Silicon substrate 102 is divided into regions 104, 106 for forming an NMOS transistor 104 and a PMOS transistor 106, respectively. A buffer layer (e.g., $SiO_2$) 108 and a hard mask (e.g. $Si_3N_4$) 110 are formed on the Silicon substrate 102, with a photo-sensitive layer (e.g., Photo-resist) 112 being placed over portions of the regions 104, 106 to preserve underlying layers during a material removing procedure (e.g., wet etching, dry etching).

Figure 2:
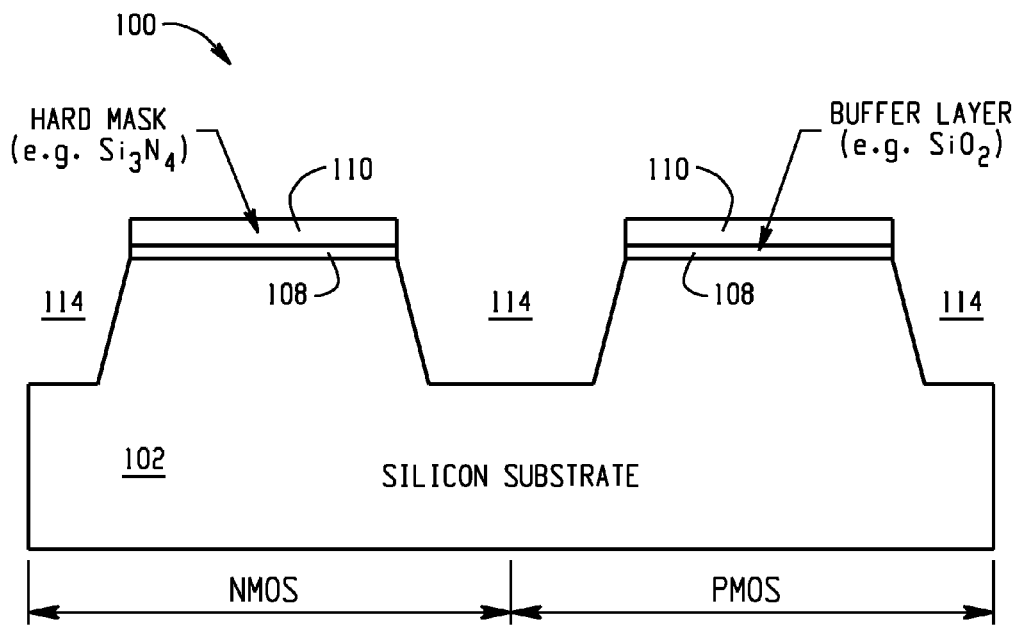
FIG. 2 depicts the semiconductor device after a material removing procedure and stripping of the photo-sensitive layer.

FIG. 2 depicts the semiconductor device 100 after the material removing procedure and stripping of the photo-sensitive layer 112. The material removing procedure eliminated certain portions of the Silicon substrate 102, the buffer layer 108, and the hard mask 110 that were not protected by the photo-sensitive layer 112 that has now been stripped from the semiconductor device 100. The material removing procedure creates certain recessed regions 114 within the Silicon substrate 102.

Figure 3:
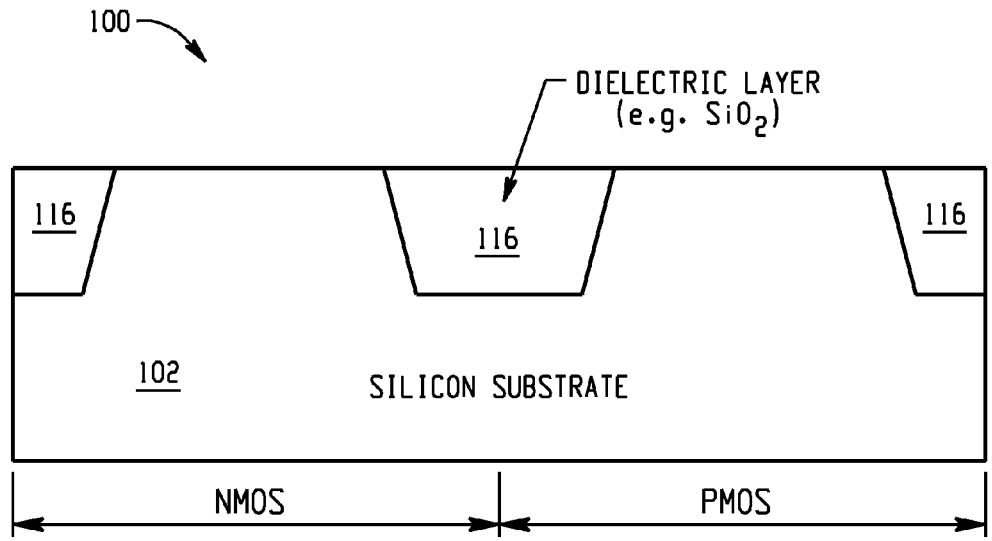
FIG. 3 depicts the semiconductor device after incorporation of a dielectric layer.

FIG. 3 depicts the semiconductor device 100 after incorporation of a dielectric layer. Following the material removing procedure, the recessed regions of the Silicon substrate 102 are filled with a dielectric material 116, such as $SiO_2$. The hard mask 110 and buffer layer 108 are removed (e.g., via chemical-mechanical polishing/planarization (CMP) process), leaving the Silicon substrate 102 having associated recessed regions containing dielectric material 116.

Figure 4:
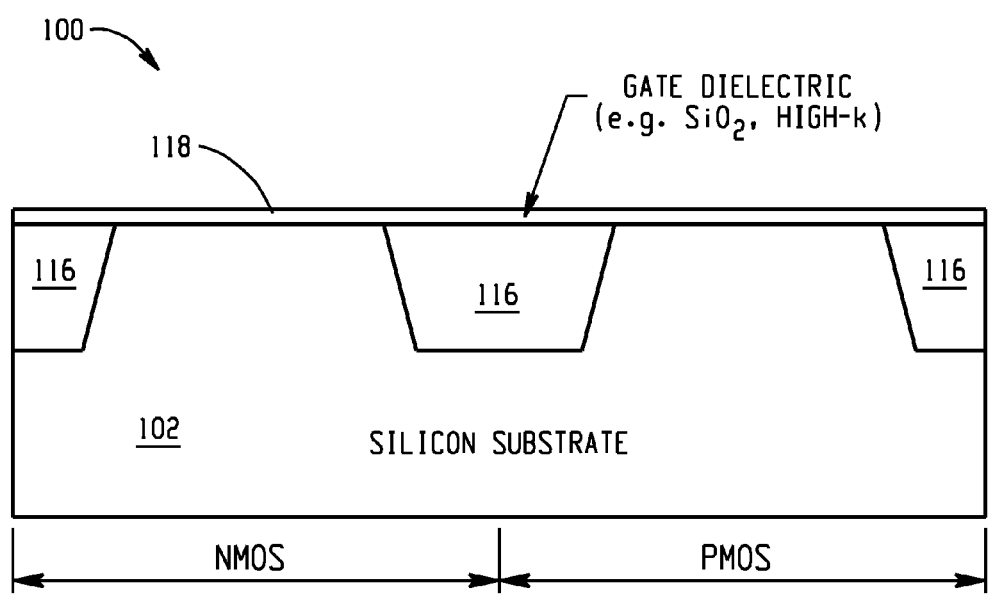
FIG. 4 depicts the semiconductor device after incorporation of a gate dielectric material.

FIG. 4 depicts the semiconductor device 100 after incorporation of a gate dielectric material. Following filling the recessed regions 114 of the Silicon substrate 102 with dielectric material 116, a gate dielectric material 118 is formed on top of the silicon substrate 102 and the dielectric material 116. The gate dielectric material 118 is formed from $SiO_2$ or a high-k material, such as $HfO_2$.

Figure 5:
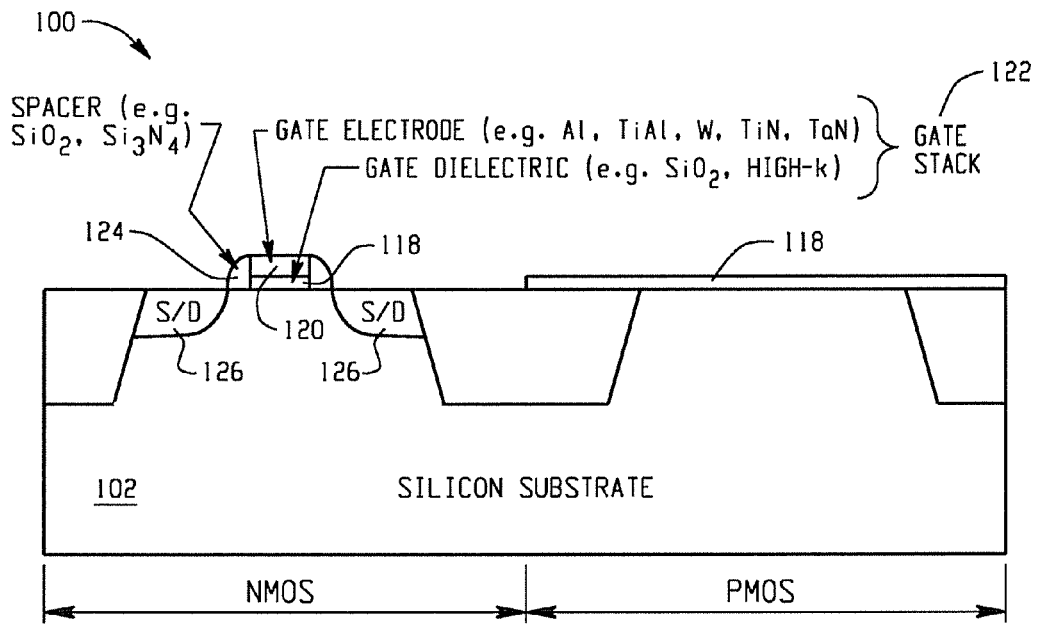
FIG. 5 depicts formation of a gate on the NMOS portion of the semiconductor device.

FIG. 5 depicts formation of a gate on the NMOS portion 104 of the semiconductor device 100. A portion of the gate dielectric 118 is removed from the NMOS portion 104 of the semiconductor device 100, leaving a smaller gate dielectric portion 118 at the left, raised portion of the silicon substrate 102. A gate electrode (e.g., Al, TiAl, W, TiN, TaN) 120 is deposited on the remaining NMOS side gate dielectric 118 to form a gate stack 122. The gate stack 122 is surrounded by a spacer material 124 (e.g., $SiO_2$, $Si_3N_4$). The areas of the NMOS raised Silicon substrate portions formed by an implantation process to the immediate left and right of the gate stack 122 are designated as source/drain regions 126 of the NMOS transistor 104.

Figure 6:
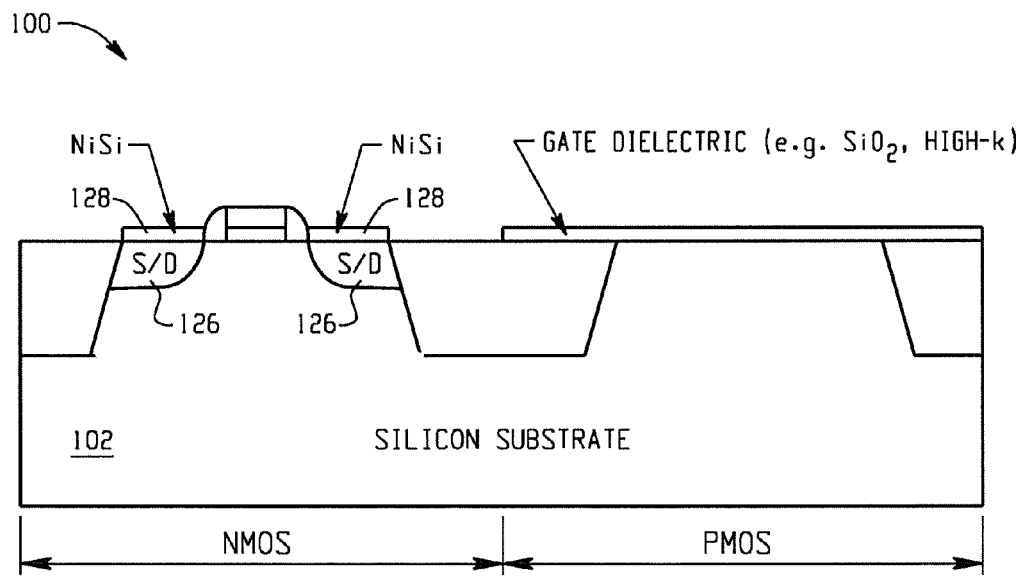
FIG. 6 depicts formation of Nickel Silicide on the source/drain regions of the NMOS transistor.

FIG. 6 depicts formation of Nickel Silicide on the source/drain regions of the NMOS transistor 104. In one embodiment, the Nickel Silicide contacts 128 on the source/drain regions 126 are formed in stages. In that example, a metal layer of Nickel is formed on the source/drain regions 126 of the Silicon substrate 102 to form a first set of source/drain contacts 128. The first set of source/drain contacts 128 is annealed with the Silicon material of the source/drain regions 126 at a first temperature (e.g., 400-600° C.) to form Nickel Silicide. Unreacted Nickel is then removed, leaving the Nickel Silicide source/drain contacts 128.

FIGS. 7-12 depict formation of components of a PMOS transistor 106 on the PMOS region 106 of the single semiconductor substrate 102 at a differing level of the semiconductor device 100 from the NMOS transistor 104. In other embodiments of the disclosure, the NMOS and PMOS transistors 104, 106 are formed on the same or nearby layers of the semiconductor device 100.

Figure 7:
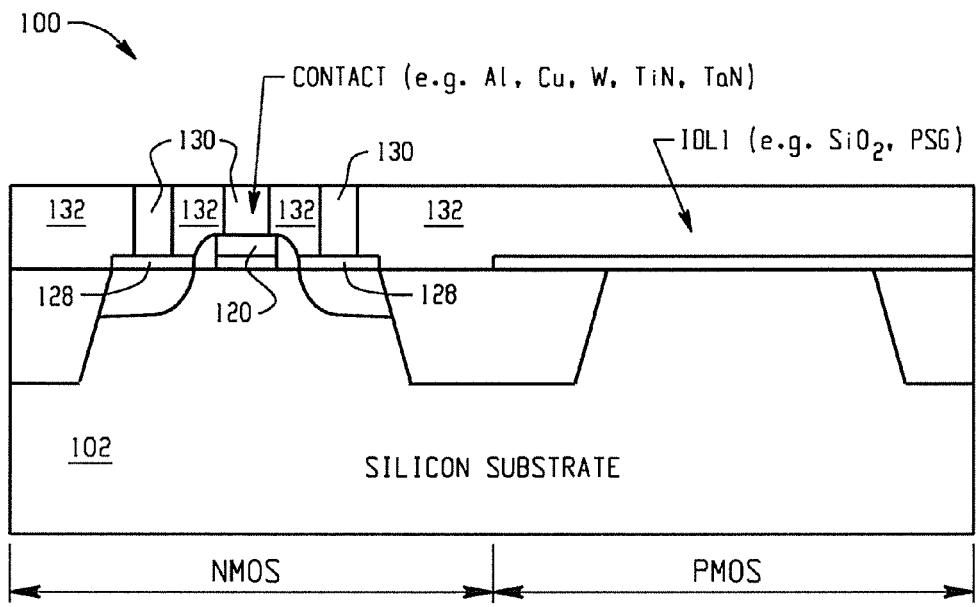
FIG. 7 depicts the formation of an inter-layer dielectric above the NMOS transistor layers.

FIG. 7 depicts the formation of an inter-layer dielectric above the NMOS transistor layers. A plurality of contact extensions (e.g., Al, Cu, W, TiN, TaN) 130 are fabricated on the source/drain contacts 128 and the gate electrode 120 to enable connection to those contacts 128 and electrode 120 from higher layers of the semiconductor device 100. An inter-layer dielectric (ILD1) 132 is formed on top of the other components from a material such as $SiO_2$ or PSG.

Figure 8:
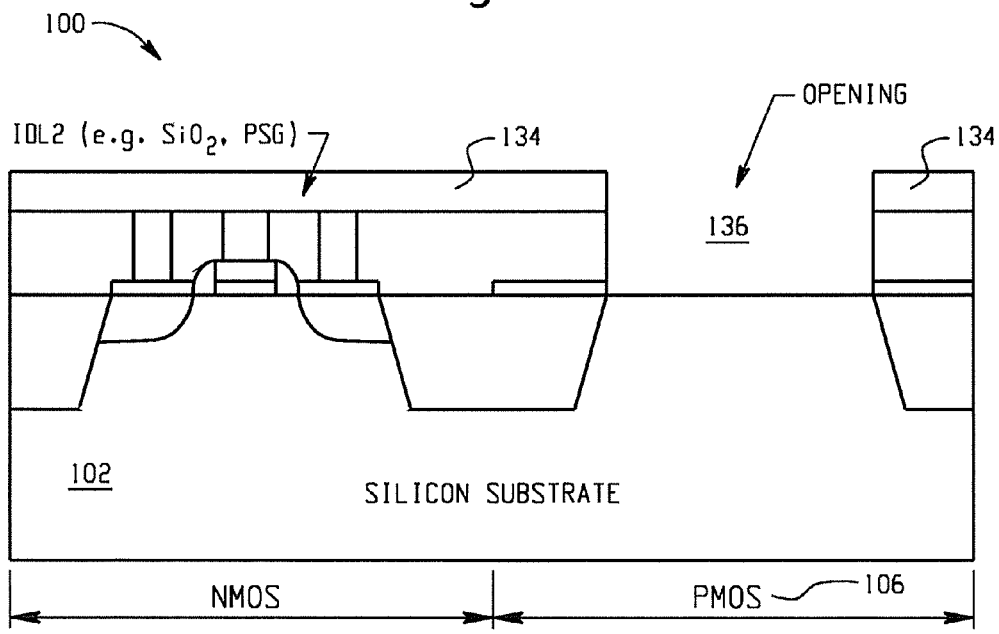
FIG. 8 depicts formation of an opening for fabrication of the PMOS transistor components.

FIG. 8 depicts formation of an opening for fabrication of the PMOS transistor components. In FIG. 8, a second inter-layer dielectric (ILD2) 134 is formed from a material such as $SiO_2$ or PSG. Further, an opening 136 is formed (e.g., via wet or dry etching) in the PMOS region 106 of the semiconductor device 100, such as to a depth of the Silicon substrate 102.

Figure 9:
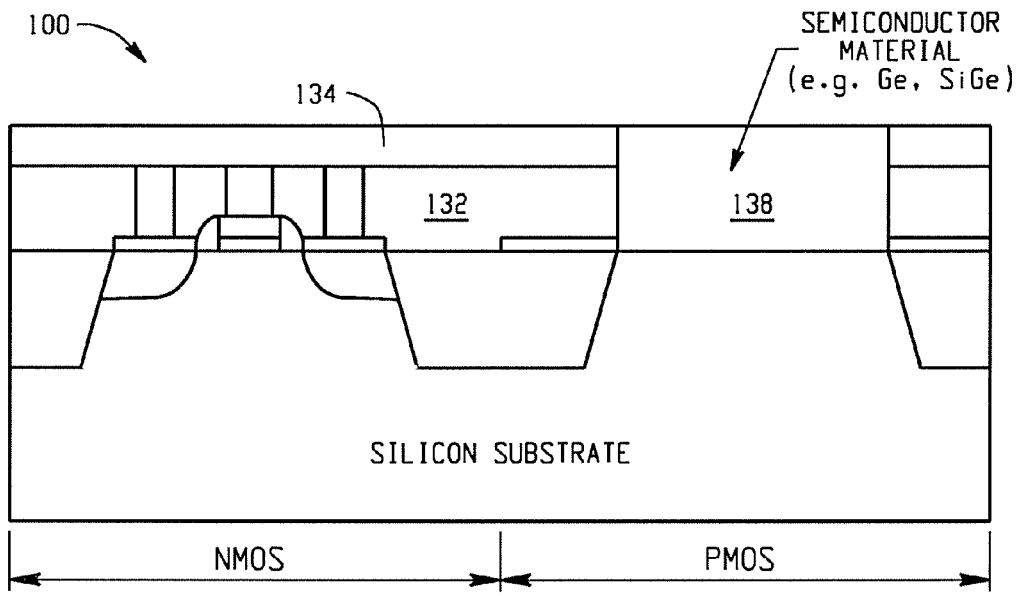
FIG. 9 depicts incorporation of an additional semiconductor material.

FIG. 9 depicts incorporation of an additional semiconductor material. In FIG. 9, the opening formed in ILD1 132 and ILD2 134 in FIG. 8 is filled with a semiconductor material 138, such as a Germanium containing material (e.g., Ge, SiGe). The top of the semiconductor material 138, in one embodiment, is further treated with a chemical-mechanical polishing/planarization (CMP) process.

Figure 10:
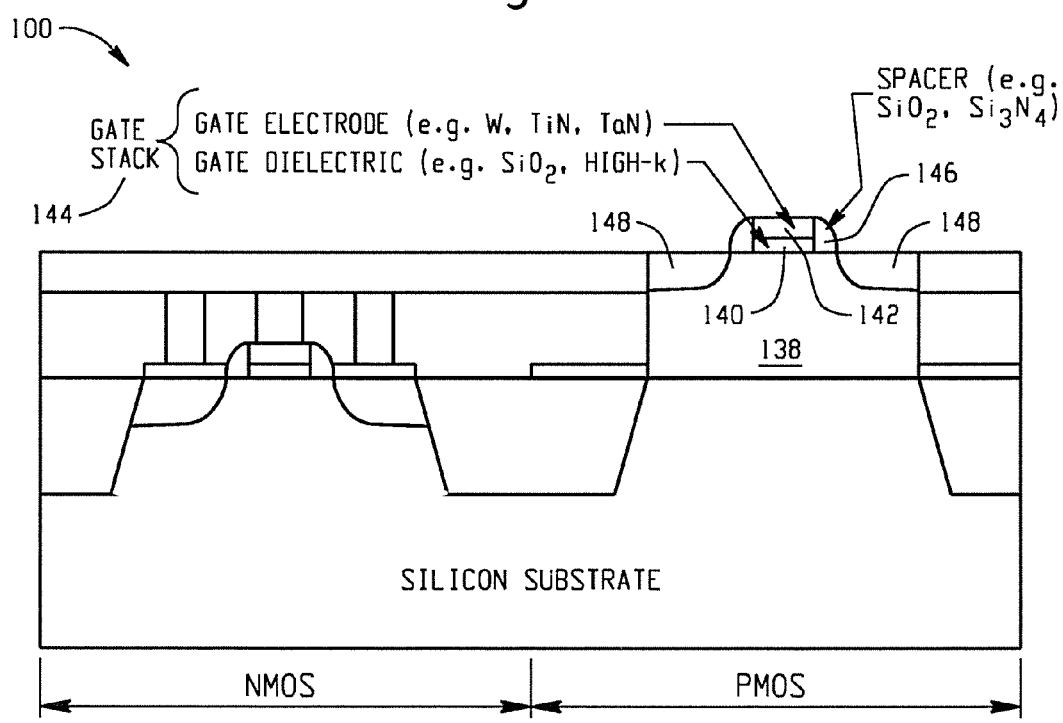
FIG. 10 depicts formation of a gate stack of the PMOS transistor.

FIG. 10 depicts formation of a gate stack of the PMOS transistor 106. A gate dielectric (e.g. $SiO_2$ or other High-k material) 140 is formed on the Germanium containing material 138, and a gate electrode (e.g. W, TiN, TaN) 142 is further formed thereon to generate a gate stack 144. The gate stack 144 is surrounded by a spacer material (e.g., $SiO_2$, $Si_3N_4$) 146, and the regions of the Germanium containing material by an implantation process to the left and right of the spacer surrounded gate stack 144 are designated as source/drain regions 148 of the PMOS transistor.

Figure 11:
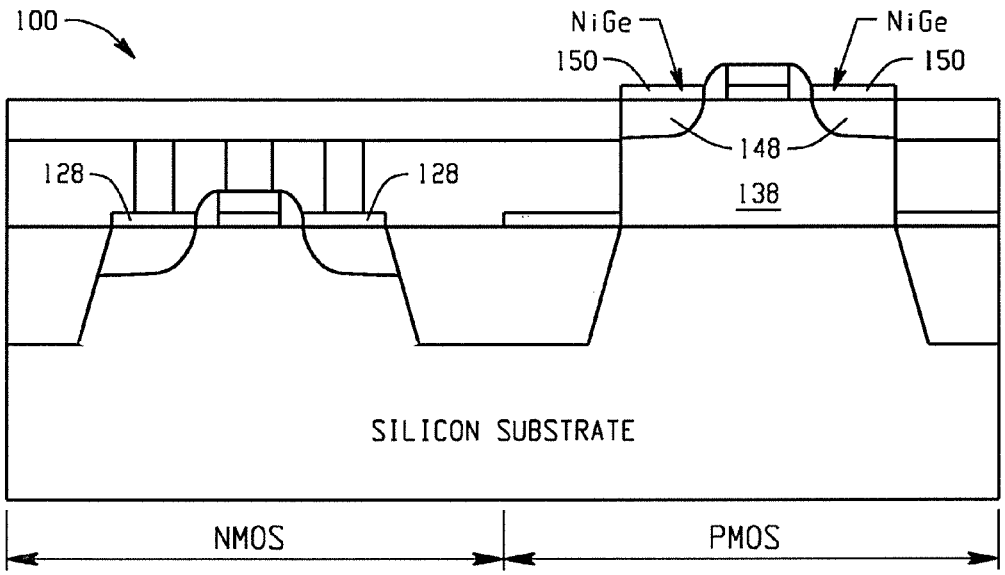
FIG. 11 depicts formation of Nickel Germanide on the source/drain regions of the PMOS transistor.

FIG. 11 depicts formation of Nickel Germanide on the source/drain regions of the PMOS transistor 106. In one embodiment, the Nickel Germanide contacts 150 on the source/drain regions 148 are formed in stages. In that example, a metal layer of Nickel is formed on the source/drain regions 148 of the Germanium containing material 138 to form a second set of source/drain contacts 150 (the NMOS source drain contacts 128 being the first set). The second set of source/drain contacts 150 is annealed with the Germanium material of the source/drain regions 148 at a second temperature (e.g., 250-300° C.) to form Nickel Germanide. Unreacted Nickel is then removed, leaving the Nickel Germanide source/drain contacts 150. Then, the substrate 102 is annealed at a third temperature (e.g., 600-750° C.) to form a low-resistance Nickel silicide and a low-resistance Nickel Germanide.

The second temperature (e.g., 250-300° C.) used in the annealing process to form the Nickel Germanide is less than the first temperature (e.g., 400-600° C.) used to form the Nickel Silicide at 128. By performing the operation in the described order, the Nickel Germanide contacts 150 are never subjected to the first temperature used in the annealing process for the Nickel Silicide contacts at 128, where the Nickel Germanide contacts 150 could be damaged by exposure to such contacts.

Figure 12:
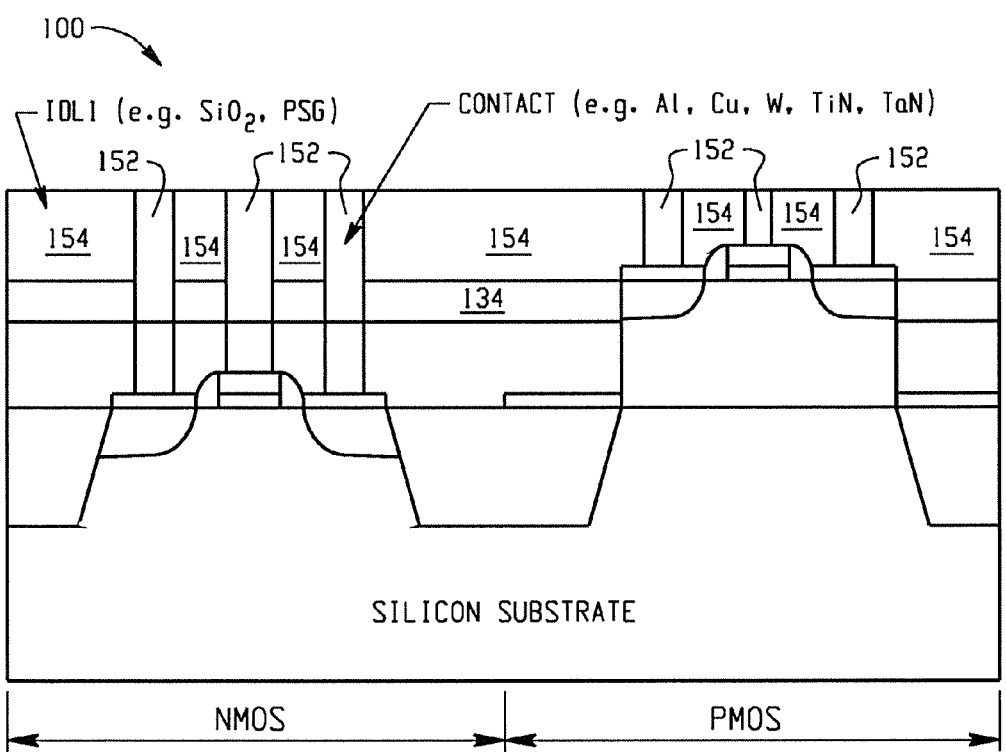
FIG. 12 depicts incorporation of a capping interlayer dielectric.

FIG. 12 depicts incorporation of a capping interlayer dielectric. Contacts (e.g., Al, Cu, W, TiN, TaN) 152 for each of the source/drain regions and the gates of the respective NMOS and PMOS transistors are extended through the second inter-layer dielectric 134, where necessary and beyond. An additional third inter-layer dielectric (ILD3) 154, formed from a dielectric such as $SiO_2$ or PSG, is formed around the contacts 152 to generate a uniform, single substrate semiconductor device.

Figure 13:
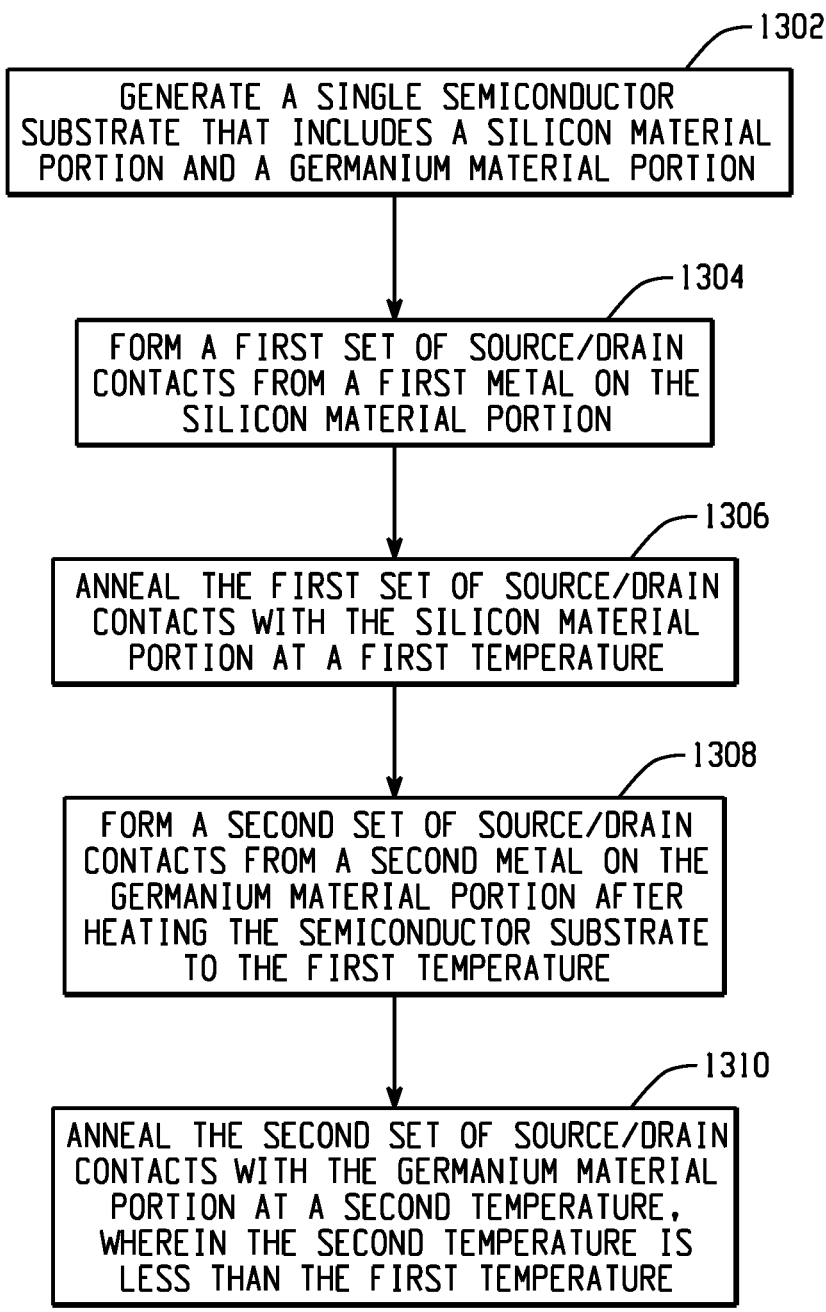
FIG. 13 is a flow diagram depicting a method of generating a semiconductor device on a single semiconductor substrate.

FIG. 13 is a flow diagram depicting a method of generating a semiconductor device on a single semiconductor substrate. At 1302, a single semiconductor substrate is generated that includes a Silicon material portion and a Germanium material portion. At 1304, a first set of source/drain contacts is formed from a first metal on the Silicon material portion. At 1306, the first set of source/drain contacts is annealed with the Silicon material portion at a first temperature. At 1308, a second set of source/drain contacts is formed from a second metal on the Germanium material portion after heating the semiconductor substrate to the first temperature, and at 1310, the second set of source/drain contacts is annealed with the Germanium material portion at a second temperature, where the second temperature is less than the first temperature.

This written description uses examples to disclose the disclosure, include the best mode, and also to enable a person skilled in the art to make and use the disclosure. The patentable scope of the disclosure may include other examples that occur to those skilled in the art. For example, certain methods include additional steps to form interconnections and for passivation.

In an embodiment, a semiconductor device comprises a substrate, first and second metals, and a second semiconductor material. The substrate includes a first semiconductor material and has first and second substrate portions. The first metal is reacted with the first substrate portion of the substrate. The second semiconductor material is above the second substrate portion of the substrate and is different from the first semiconductor material. The second metal is reacted with the second semiconductor material.

In another embodiment, a method comprises: forming a first source/drain contact over a first source/drain region of a substrate; fabricating a first contact extension that extends from the first source/drain contact; forming a second source/drain contact over a second source/drain region; fabricating a second contact extension that extends from the first contact extension; and fabricating a third contact extension that extends from the second source/drain contact. Forming the second source/drain contact is performed after fabricating the first contact extension and prior to fabricating the second contact extension.

In another embodiment, a method comprises: forming a first source/drain contact over a first source/drain region of a substrate; fabricating a first contact extension that extends from the first source/drain contact; forming a second source/drain contact over a second source/drain region; fabricating a second contact extension that extends from the second source/drain contact; and fabricating a third contact extension that extends from the first contact extension. Fabricating the second contact extension is performed after fabricating the first contact extension and at the same time as fabricating the third contact extension.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor device comprising:
   a substrate including a first semiconductor material and having first and second substrate portions;
   a first metal reacted with the first substrate portion of the substrate;
   a second semiconductor material above the second substrate portion of the substrate and different from the first semiconductor material; and
   a second metal reacted with the second semiconductor material, wherein:
   the first semiconductor material is Si and the second semiconductor material is SiGe or Ge,
   the semiconductor device further comprises:
      a first gate dielectric material formed above the first substrate portion of the substrate;
      a first gate electrode formed above the first gate dielectric material; and
      a first contact in contact with the first metal, and
   an upper surface of the second semiconductor material is higher than an upper surface of the first contact.

2. The semiconductor device of claim 1, further comprising a dielectric layer between the first and second substrate portions of the substrate, wherein each of the first and second substrate portions of the substrate and the dielectric layer has a top surface and wherein the top surface of the dielectric layer is flush with the top surface of one of the first and second substrate portions of the substrate.

3. The semiconductor device of claim 1, wherein the second metal is the same as the first metal.

4. A semiconductor device comprising:
   a substrate including a first semiconductor material and having first and second substrate portions;
   a first metal reacted with the first substrate portion of the substrate;
   a second semiconductor material above the second substrate portion of the substrate and different from the first semiconductor material; and
   a second metal reacted with the second semiconductor material,
   wherein the second semiconductor material has a sidewall, and
   the semiconductor device further comprises:
      a first gate dielectric material formed above the first substrate portion of the substrate;
      a first gate electrode formed above the first gate dielectric material; and
      a second gate dielectric material formed on the sidewall of the second semiconductor material and the same as the first gate dielectric material.

5. The semiconductor device of claim 4, wherein the first and second gate dielectric materials have substantially the same thickness.

6. The semiconductor device of claim 4, further comprising a dielectric material that surrounds the second semiconductor material, the first metal, and the first and second gate dielectric materials.

7. A method comprising:
   forming a first source/drain contact over a first source/drain region of a substrate;
   fabricating a first contact extension that extends from the first source/drain contact;
   forming a second source/drain contact over a second source/drain region;
   fabricating a second contact extension that extends from the first contact extension; and
   fabricating a third contact extension that extends from the second source/drain contact,
   wherein forming the second source/drain contact is performed after fabricating the first contact extension and prior to fabricating the second contact extension.

8. The method of claim 7, further comprising:
   removing a portion of the substrate to form a recessed region between first and second substrate portions of the substrate;
   filling the recessed region with a dielectric material; and
   planarizing the dielectric material such that a top surface of the dielectric material is flush with a top surface of one of the first and second substrate portions of the substrate.

9. The method of claim 8, further comprising forming a semiconductor material over the second substrate portion of the substrate and different from a material of the substrate.

10. The method of claim 9, wherein:
forming the first source/drain contact includes reacting a first metal with the first substrate portion of the substrate; and
forming the second source/drain contact includes reacting a second metal with the semiconductor material.

11. The method of claim 10, wherein reacting the second metal is such that the second metal is the same as the first metal.

12. The method of claim 9, further comprising:
forming a gate dielectric material over the first and second substrate portions of the substrate;
forming a gate electrode above the gate dielectric material over the first substrate portion of the substrate; and
removing a portion of the gate dielectric material to form an opening in the gate dielectric material over the second substrate portion of the substrate, wherein forming the semiconductor material includes growing the semiconductor material in the opening.

13. The method of claim 9, further comprising:
depositing an inter-layer dielectric on the first and second substrate portions of the substrate; and
removing a portion of the inter-layer dielectric to form an opening in the inter-layer dielectric on the second substrate portion of the substrate, wherein forming the semiconductor material includes growing the semiconductor material in the opening.

14. A method comprising:
forming a first source/drain contact over a first source/drain region of a substrate;
fabricating a first contact extension that extends from the first source/drain contact;
forming a second source/drain contact over a second source/drain region;
fabricating a second contact extension that extends from the second source/drain contact; and
fabricating a third contact extension that extends from the first contact extension,
wherein fabricating the second contact extension is performed after fabricating the first contact extension and at the same time as fabricating the third contact extension.

15. The method of claim 14, further comprising:
removing a portion of the substrate to form a recessed region between first and second substrate portions of the substrate;
filling the recessed region with a dielectric material; and
planarizing the dielectric material such that a top surface of the dielectric material is flush with a top surface of one of the first and second substrate portions of the substrate.

16. The method of claim 15, further comprising forming a semiconductor material over the second substrate portion of the substrate and different from a material of the substrate.

17. The method of claim 16, wherein:
forming the first source/drain contact includes reacting a first metal with the first substrate portion of the substrate; and
forming the second source/drain contact includes reacting a second metal with the semiconductor material.

18. The method of claim 17, wherein reacting the second metal is such that the second metal is the same as the first metal.

19. The method of claim 16, further comprising:
forming a gate dielectric material over the first and second substrate portions of the substrate;
forming a gate electrode above the gate dielectric material over the first substrate portion of the substrate; and
removing a portion of the gate dielectric material to form an opening in the gate dielectric material over the second substrate portion of the substrate, wherein forming the semiconductor material includes growing the semiconductor material in the opening.

20. The method of claim 16, further comprising:
depositing an inter-layer dielectric on the first and second substrate portions of the substrate; and
removing a portion of the inter-layer dielectric to form an opening in the inter-layer dielectric on the second substrate portion of the substrate, wherein forming the semiconductor material includes growing the semiconductor material in the opening.

* * * * *